(12) United States Patent
Jeong

(10) Patent No.: US 10,950,625 B2
(45) Date of Patent: Mar. 16, 2021

(54) SEMICONDUCTOR DEVICE AND MANUFACTURING METHOD OF THE SEMICONDUCTOR DEVICE

(71) Applicant: SK hynix Inc., Icheon-si (KR)

(72) Inventor: Yeo Jin Jeong, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/442,978

(22) Filed: Jun. 17, 2019

(65) Prior Publication Data

US 2020/0144286 A1 May 7, 2020

(30) Foreign Application Priority Data

Nov. 2, 2018 (KR) .......................... 10-2018-0133341

(51) Int. Cl.
*H01L 27/11582* (2017.01)
*H01L 27/11573* (2017.01)
*H01L 29/423* (2006.01)
*H01L 21/28* (2006.01)

(52) U.S. Cl.
CPC .. *H01L 27/11582* (2013.01); *H01L 27/11573* (2013.01); *H01L 29/40117* (2019.08); *H01L 29/4234* (2013.01)

(58) Field of Classification Search
CPC ........ H01L 27/11565–11582; H01L 29/40117; H01L 29/4234
See application file for complete search history.

(56) References Cited

U.S. PATENT DOCUMENTS

| | | | |
|---|---|---|---|
| 9,620,512 B1 | 4/2017 | Nishikawa et al. | |
| 2015/0206900 A1* | 7/2015 | Nam | H01L 27/0207 257/326 |
| 2019/0305096 A1* | 10/2019 | Choi | H01L 27/11582 |

FOREIGN PATENT DOCUMENTS

KR 1020180026211 A 3/2018

* cited by examiner

*Primary Examiner* — Stephen M Bradley
(74) *Attorney, Agent, or Firm* — William Park & Associates Ltd.

(57) ABSTRACT

A method of manufacturing a semiconductor device includes replacing sacrificial layers with conductive patterns through slits and at least one opening that pass through a stack structure. The stack structure includes interlayer insulating layers and the sacrificial layers. The interlayer insulating layers and the sacrificial layers surround a support and are alternately stacked on each other.

19 Claims, 16 Drawing Sheets

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2018-0133341, filed on Nov. 2, 2018, the entire disclosure of which is incorporated herein by reference in its entirety.

BACKGROUND

1. Technical Field

Various embodiments generally relate to a semiconductor device and a method of manufacturing the semiconductor device, and more particularly, to a three-dimensional semiconductor device and a method of manufacturing the three-dimensional semiconductor device.

2. Related Art

A semiconductor device may include a memory cell array including a plurality of memory cells. The memory cell array may include memory cells arranged in various structures. To improve integration density of a semiconductor device, a three-dimensional semiconductor device has been proposed. The three-dimensional semiconductor device includes electrode patterns stacked to be spaced apart from each other. Resistance of the electrode patterns of the three-dimensional semiconductor device may be increased by various causes. When the resistance of the electrode patterns is excessively increased, a defect in a semiconductor device may occur.

SUMMARY

According to an embodiment, a semiconductor device may include a stack structure including interlayer insulating layers and electrode patterns which are alternately stacked on each other, and a support passing through the stack structure. Each of the electrode patterns may include a first conductive pattern penetrated by the support, at least one second conductive pattern extending along a side portion of the stack structure, and at least one third conductive pattern disposed between the first conductive pattern and the support. The first conductive pattern may include a first conductive material and each of the second and third conductive patterns may include a second conductive material having a lower resistance than the first conductive material.

According to an embodiment, a semiconductor device may include interlayer insulating layers stacked to be spaced apart from each other, a support passing through the interlayer insulating layers, at least one opening passing through the interlayer insulating layers to expose a sidewall of the support, and electrode patterns filling spaces between the interlayer insulating layers disposed between the slits.

According to an embodiment, a method of manufacturing a semiconductor device may include forming a stack structure including interlayer insulating layers and sacrificial layers which surround a support and are alternately stacked on each other, forming slits which pass through the stack structure, wherein the support is disposed between the slits, forming a first opening which passes through the stack structure, wherein the first opening opens a side portion of the support, forming second openings by removing the sacrificial layers through the slits and the first opening, and forming an electrode pattern in each of the second openings through the slits and the first opening.

DETAILED DESCRIPTION

The technical spirit of the present disclosure may include examples of embodiments to which various modifications and changes may be applied and which include various forms. Hereinafter, embodiments of the present disclosure will be described in order for those skilled in the art to which the present disclosure pertains to be able to readily implement the technical spirit of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

Terms used in the present application are used to describe particular embodiments, and are not intended to limit the present disclosure. Singular forms in the present disclosure are intended to include plural forms as well, unless the context clearly indicates otherwise. In the present specification, terms "include" and "have" indicate that a feature, a number, a step, an operation, a component, a part or the combination those of described in the specification is present, but do not exclude a possibility of the presence of one or more other additional features, numbers, steps, operations, components, parts or combinations thereof.

Various embodiments may be directed to a semiconductor device that may be capable of improving operational reliability, and a method of manufacturing the semiconductor device.

Figure 1A:
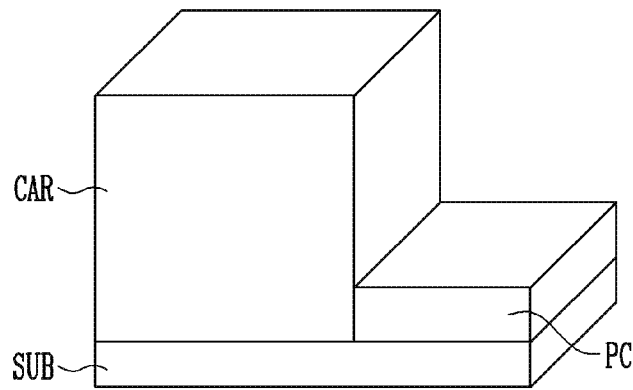
FIGS. 1A and 1B are schematic block diagrams illustrating semiconductor devices according to embodiments.
Figure 1B:
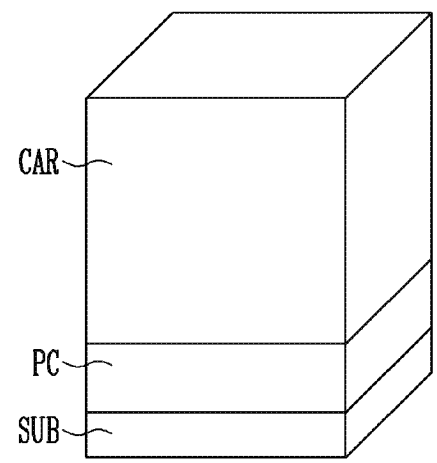

FIGS. 1A and 1B are schematic block diagrams illustrating semiconductor devices according to embodiments.

Referring to FIGS. 1A and 1B, each of the semiconductor devices, according to embodiments, may include a peripheral circuit structure PC and a cell array CAR which are arranged on a substrate SUB.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The cell array CAR may include a plurality of memory blocks. Each of the memory blocks may include a plurality of cell strings. Each of the cell strings may be electrically coupled to a bit line, a source line, word lines and select lines. Each of the cell strings may include memory cells and select transistors which are coupled in series with each other. Each of the select lines may serve as a gate electrode of a corresponding one of the select transistors. Each of the word lines may serve as a gate electrode of a corresponding one of the memory cells.

The peripheral circuit structure PC may include NMOS transistors and PMOS transistors, a resistor, and a capacitor which are electrically coupled to the cell array CAR. The NMOS and PMOS transistors, the resistor, and the capacitor may serve as elements forming a row decoder, a column decoder, a page buffer, and a control circuit.

As shown in FIG. 1A, the peripheral circuit structure PC may be arranged on a region of the substrate SUB which does not overlap with the cell array CAR.

Alternatively, as shown in FIG. 1B, the peripheral circuit structure PC may be arranged between the cell array CAR and the substrate SUB. Since the peripheral circuit structure PC overlaps with the cell array CAR, an area of the substrate SUB where the cell array CAR and the peripheral circuit structure PC are provided may be reduced.

Figure 2:
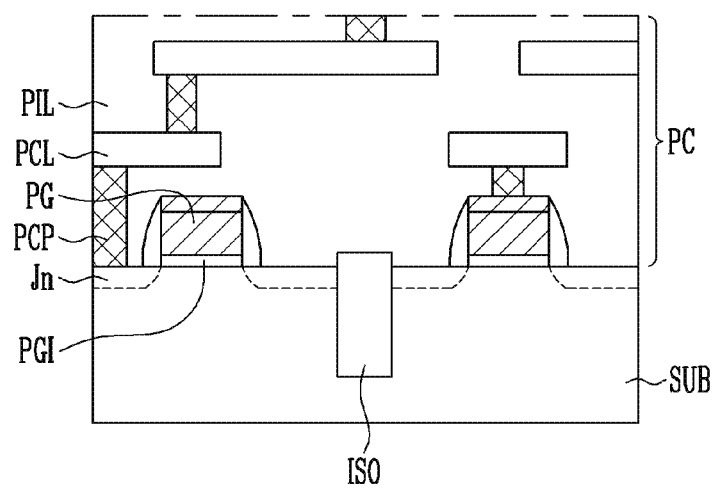
FIG. 2 is a schematic cross-sectional diagram illustrating a peripheral circuit structure.

FIG. 2 is a schematic cross-sectional diagram illustrating the peripheral circuit structure PC. The peripheral circuit structure PC, as shown in FIG. 2, may be included in the peripheral circuit structure PC as shown in FIG. 1A, or the peripheral circuit structure PC as shown in FIG. 1B.

Referring to FIG. 2, the peripheral circuit structure PC may include peripheral gate electrodes PG, a peripheral gate insulating layer PGI, junctions Jn, peripheral circuit lines PCL, peripheral contact plugs PCP and a peripheral circuit insulating layer PIL.

Each of the peripheral gate electrodes PG may serve as gate electrodes of an NMOS transistor or a PMOS transistor of the peripheral circuit structure PC. The peripheral gate insulating layer PGI may be arranged between each of the peripheral gate electrodes PG and the substrate SUB.

The junctions Jn may be defined by injecting n-type or p-type impurities into an active region of the substrate SUB. The junctions Jn may be located at both sides of each of the peripheral gate electrodes PG and may serve as a source junction or a drain junction. The active region of the substrate SUB may be divided by an isolation layer ISO formed in the substrate SUB. The isolation layer ISO may include an insulating material.

The peripheral circuit lines PCL may be electrically coupled to a circuit of the peripheral circuit structure PC through the peripheral contact plugs PCP.

The peripheral circuit insulating layer PIL may cover the circuit of the peripheral circuit structure PC, the peripheral circuit lines PCL, and the peripheral contact plugs PCP. The peripheral circuit insulating layer PIL may include insulating layers which are stacked to form multiple layers.

FIGS. 3A to 3E are schematic perspective views illustrating semiconductor devices according to embodiments. The schematic perspective views are arranged based on a first direction I, a second direction II, and a third direction III. Each of the directions may be perpendicular to the other two directions. For convenience of recognition, interlayer insulating layers are not illustrated in FIGS. 3A to 3E.

Referring to FIGS. 3A to 3E, the semiconductor device according to an embodiment may include a plurality of memory strings CST. The memory strings CST may include memory cells and select transistors that are arranged along channel structures CH. For example, each of the memory strings CST may include memory cells and select transistors that are coupled in series by the corresponding channel structure CH. The memory cells of each of the memory strings CST may be arranged in three dimensions to improve integration density of the semiconductor device.

Each of the channel structures CH may be electrically coupled to a bit line BL corresponding thereto. The bit line BL may extend in the second direction II, on a plane perpendicular to the first direction I. According to an embodiment, the bit line BL may directly contact the channel structure CH, corresponding thereto, as shown in FIGS. 3A to 3D. According to an embodiment, the bit line BL may be coupled to the channel structure CH, corresponding thereto, via a contact plug DCT as shown in FIG. 3E. The contact plug DCT may contact the bit line BL to extend towards the corresponding channel structure CH.

Gates of the memory cells and gates of the select transistors may be coupled to electrode patterns CP1 to CPn stacked to be spaced apart from each other in the first direction I. The electrode patterns CP1 to CPn may serve as word lines WL, source select lines SSL, and drain select lines DSL. The electrode patterns CP1 to CPn may be disposed in the first to nth layers sequentially arranged and spaced apart from each other in the first direction I, respectively. The first layer may be defined as a layer disposed farthest from the bit line BL and the nth layer may be defined as a layer disposed closest to the bit line BL. Each of the electrode patterns CP1 to CPn may extend in the plane perpendicular to the first direction I.

Referring to FIGS. 3A to 3D, at least the nth electrode patterns CPn, disposed in the nth layer among the electrode patterns CP1 to CPn, may serve as the drain select lines DSL. However, the embodiments are not limited thereto, and electrode patterns, disposed in two or more layers, may serve as the drain select lines DSL. According to an embodiment, the nth electrode patterns CPn, disposed in the nth layer, and the (n–1)th electrode patterns CPn–1, disposed in the (n–1)th layer, may serve as the drain select lines DSL.

At least the first patterns CP1, disposed in the first layer among the electrode patterns CP1 to CPn, may serve as the source select lines SSL. However, the embodiments are not limited thereto, and electrode patterns, arranged in two or more layers, may serve as the source select lines SSL. According to an embodiment, the first electrode patterns CP1, disposed in the first layer, and the second electrode patterns CP2, disposed in the second layer, may serve as the source select lines SSL.

Electrode patterns, disposed between the drain select lines DSL and the source select lines SSL, may serve as the word lines WL. For example, referring to FIGS. 3A to 3D, the electrode patterns CP3 to CPn−2 may serve as the word lines WL.

The electrode patterns CP1 to CPn may be separated from each other by a first slit SI1 in each layer. Electrode patterns that serve as the drain select lines DSL among the electrode patterns CP1 to CPn may be separated from each other, not only by the first slit SI1, but also by a second slit SI2 in each layer. However, embodiments are not limited thereto. Although not illustrated in FIGS. 3A to 3D, electrode patterns that serve as the source select lines SSL among the electrode patterns CP1 to CPn may be separated from each other, not only by the first slit SI1, but also by a third slit. Although not illustrated in FIGS. 3A to 3D, the second slit SI2 may be omitted and the drain select lines DSL may be separated from each other by the first slit SI1 in each layer. The second slit SI2 and the third slit may have a depth which does not pass through the word lines WL.

The first slit SI1 and the second slit SI2 may extend in a third direction III on a plane perpendicular to the second direction II. The channel structures CH, shared by each of the word lines WL, may be divided into two or more groups that are controlled by the different drain select lines DSL. According to an embodiment, the drain select lines DSL may include a first drain select line and a second drain select line that are separated from each other by the second slit SI2. The channel structures CH, shared by each of the word lines WL, may be divided into a first group which is controlled by the first drain select line and a second group which is controlled by the second drain select line.

Each of the word lines WL, the drain select lines DSL, and the source select lines SSL may commonly surround at least one column of the channel structures CH. The channel structures CH, surrounded by each of the word lines WL, the drain select lines DSL, and the source select lines SSL, may be arranged in a zigzag pattern.

The drain select lines DSL, disposed in the same layer, may be separated from each other by the first slit SI1 and the second slit SI2. In an embodiment, each of the word lines WL may extend in the second direction II without the second slit SI2. Therefore, each of the word lines WL may overlap with the second slit SI2 in the first direction I. Although not illustrated in FIGS. 3A to 3D, the source select lines SSL, disposed in the same layer, may be separated, not only by the first slit SI1, but also by the third slit. Each of the word lines WL may extend in the second direction II without the third slit. Therefore, each of the word lines WL may overlap with the third slit in the first direction I.

Figure 3A:
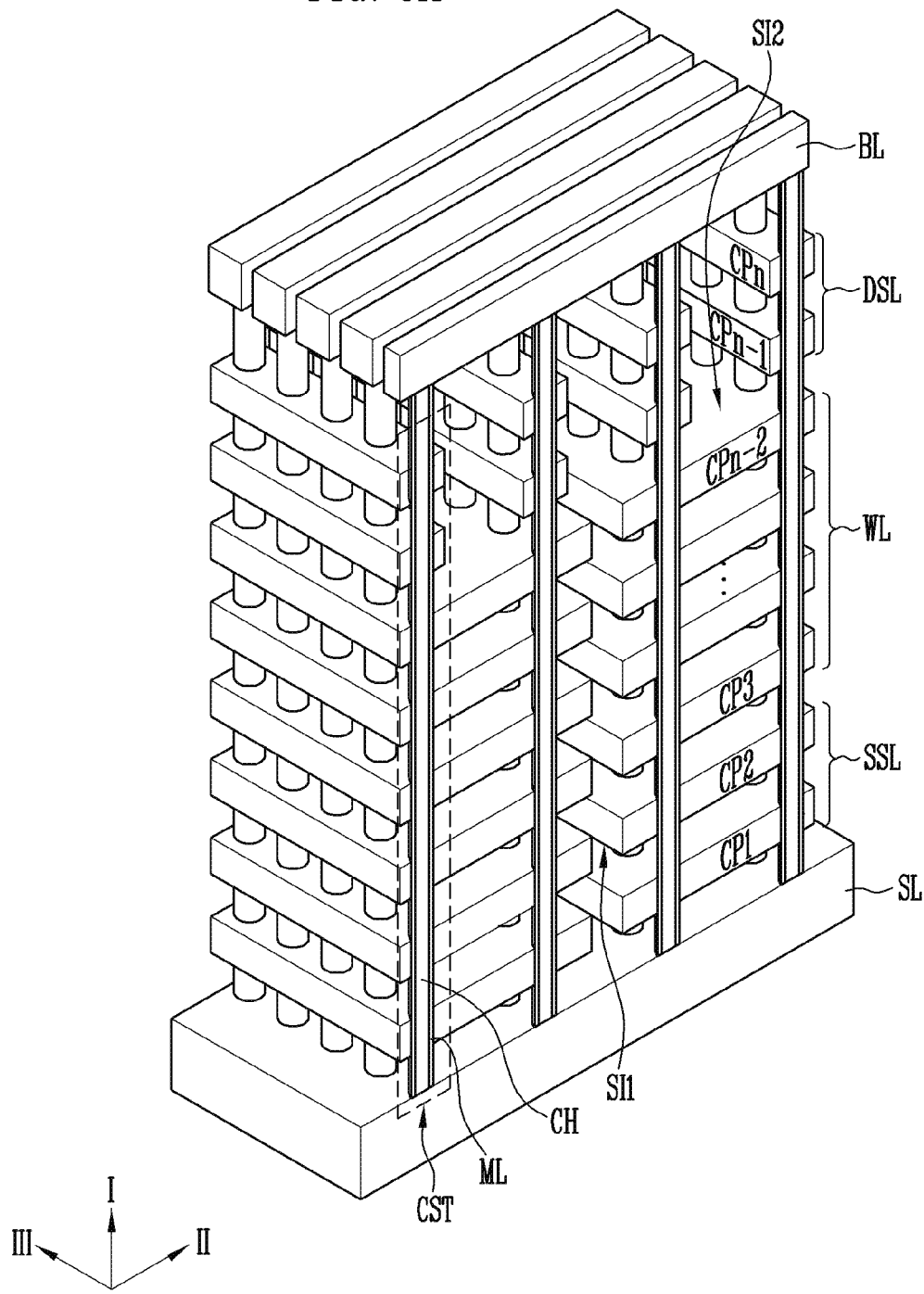
FIGS. 3A to 3E are schematic perspective views illustrating semiconductor devices according to embodiments.
Figure 3B:
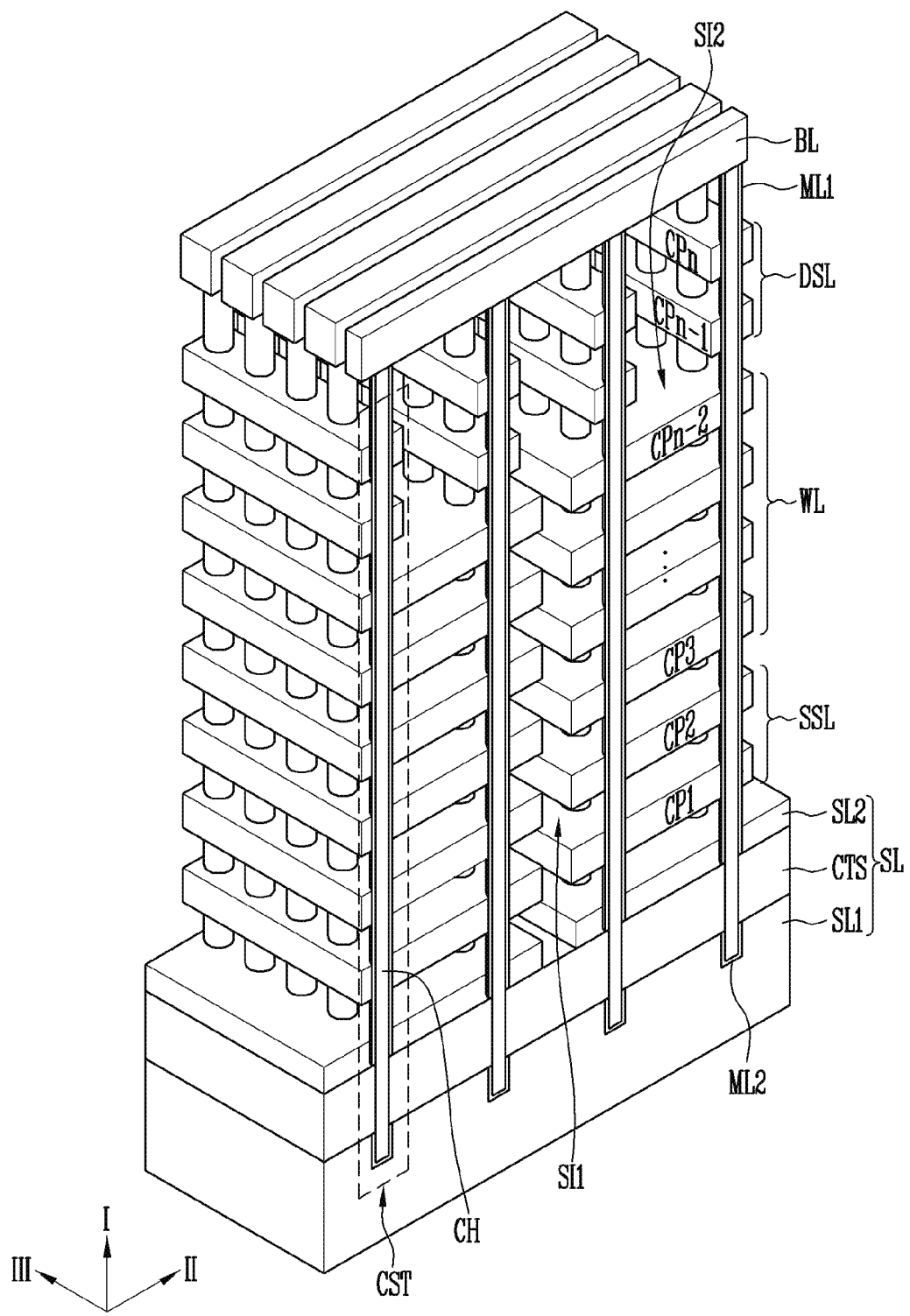
Figure 3C:
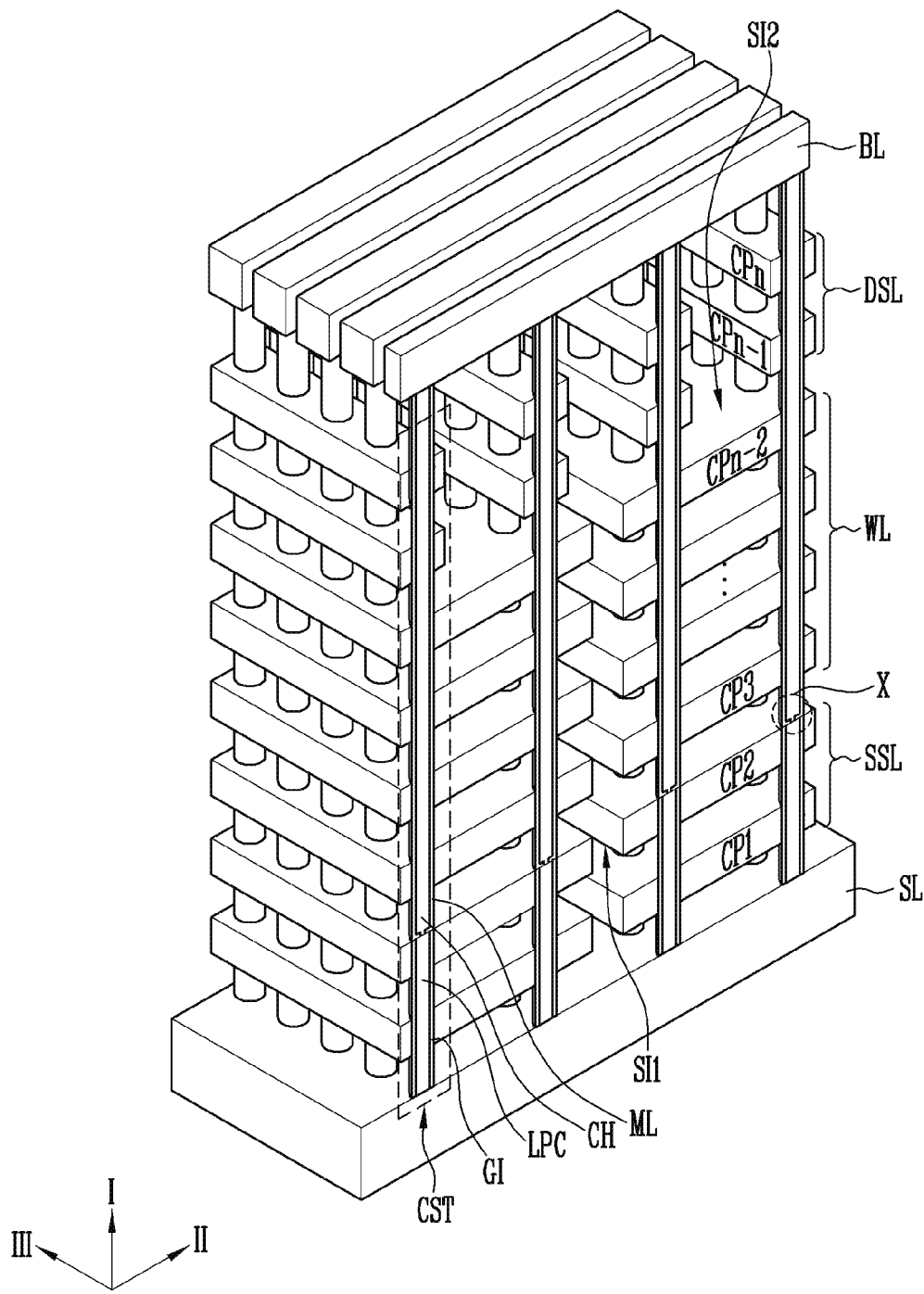
Figure 3D:
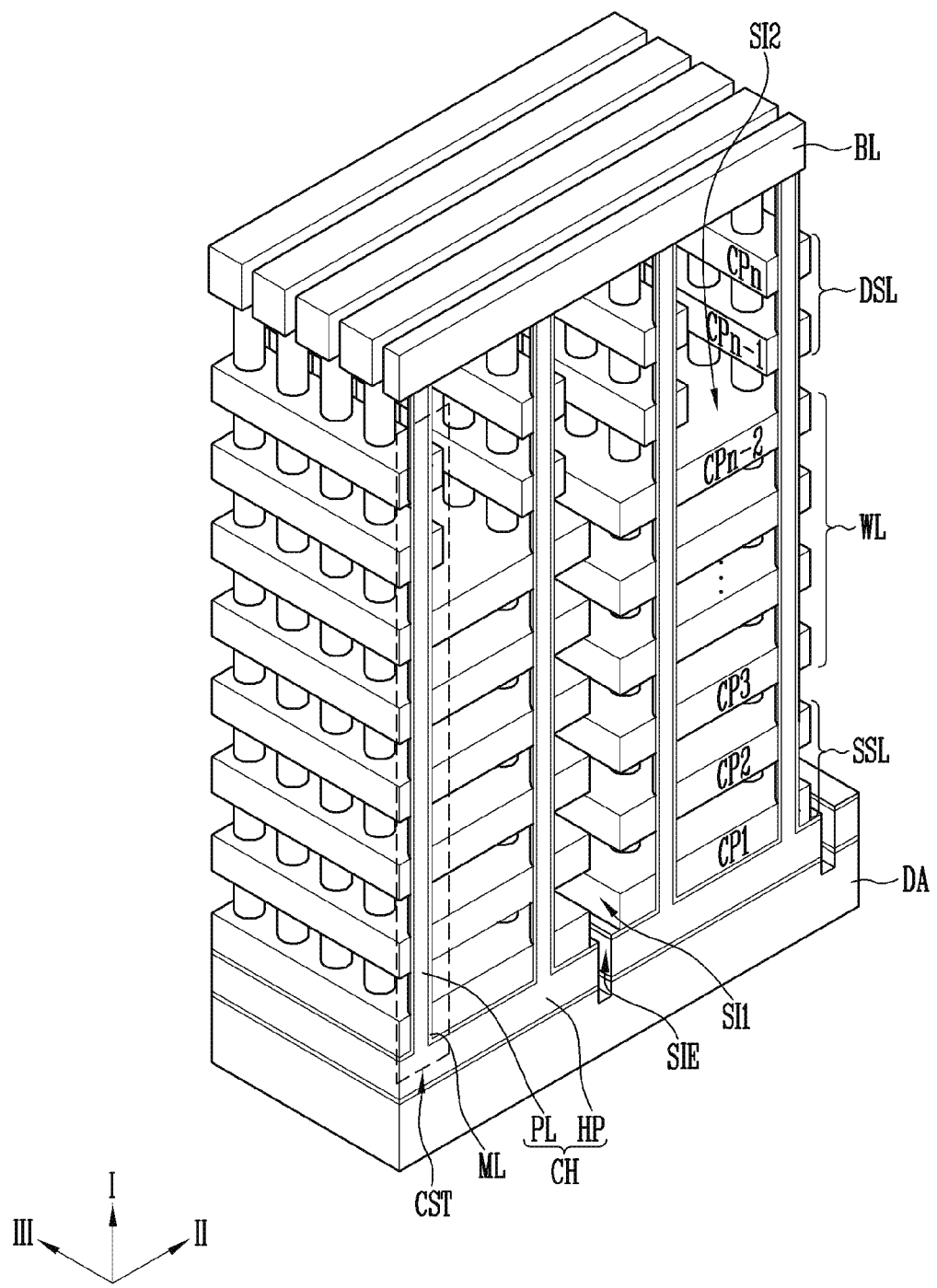
Figure 3E:
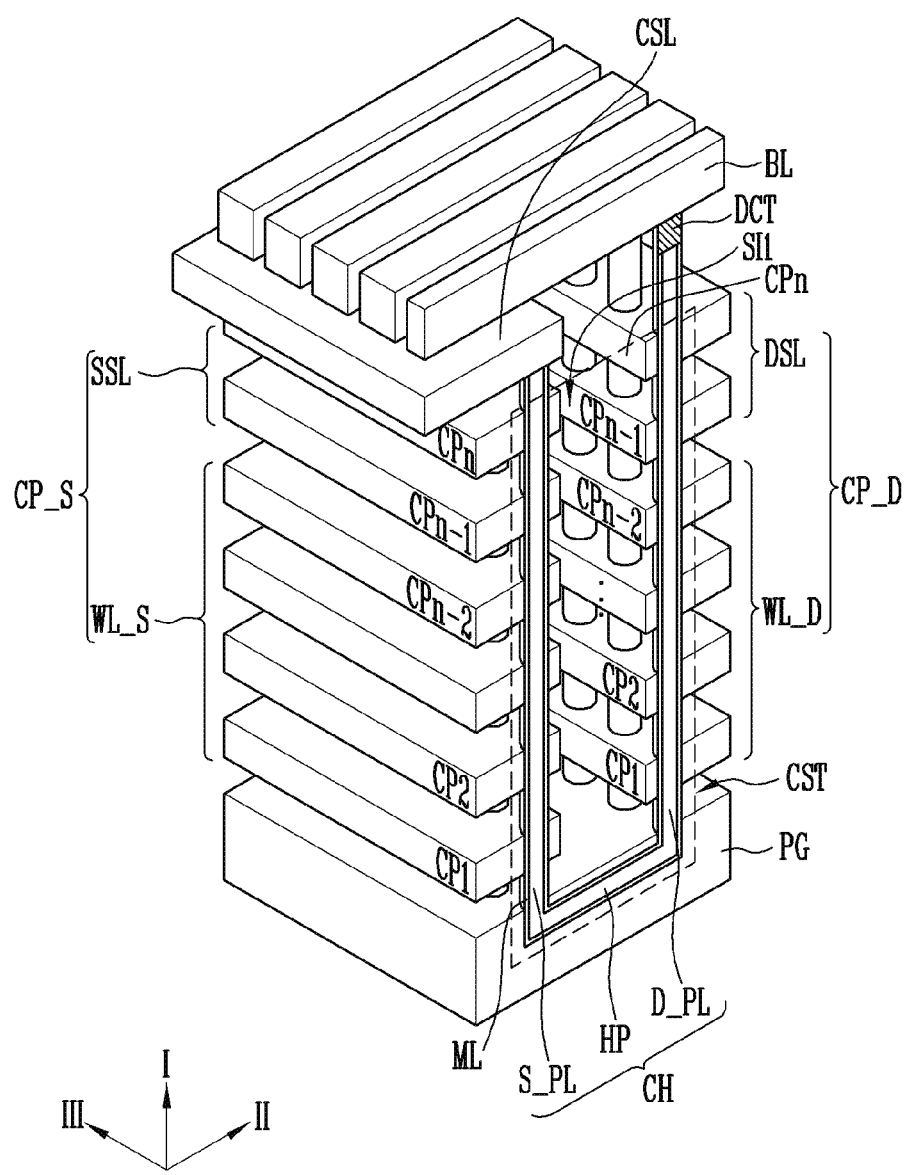

Referring to FIGS. 3A, 3B, and 3D, each of the channel structures CH may pass through the drain select lines DSL, the word lines WL, and the source select lines SSL. Referring to FIG. 3C, each of the channel structures CH may pass through the drain select lines DSL and the word lines WL.

Referring to FIGS. 3A and 3B, the channel structures CH may be directly coupled to a source layer SL, disposed under the electrode patterns CP1 to CPn. The source layer SL may have various structures.

Referring to FIG. 3A, the source layer SL may contact a bottom surface of each of the channel structures CH. The source layer SL may include a doped semiconductor layer including a source dopant. A source dopant may include an n-type impurity. According to an embodiment, the source layer SL may be formed by injecting a source dopant from a surface of the substrate SUB, described with reference to FIG. 1A, towards the inside of the substrate SUB. According to an embodiment, the source layer SL may be formed by depositing a doped semiconductor layer on the substrate SUB, described with reference to FIG. 1B. When the source layer SL is formed by depositing a doped semiconductor layer on the substrate SUB, an insulating layer may be disposed between the substrate SUB and the doped semiconductor layer. According to an embodiment, a doped semiconductor layer may include doped silicon.

Each of the channel structures CH may contact a top surface of the source layer SL, pass through the electrode patterns CP1 to CPn, and extend towards the bit line BL in the first direction I. A sidewall of each of the channel structures CH may be surrounded by a multilayer film ML. The multilayer film ML may extend along the sidewall of the channel structure CH corresponding to the multilayer film ML. A top surface and a bottom surface of each of the channel structures CH may be opened and is not blocked by the multilayer film ML.

Referring to FIG. 3B, the channel structures CH may pass through the electrode patterns CP1 to CPn and extend into the source layer SL. A sidewall of each of the channel structures CH may contact the source layer SL.

The source layer SL may include a first source layer SL1 and a contact source layer CTS. The source layer SL may further include a second source layer SL2. The channel structures CH may pass through the second source layer SL2 and the contact source layer CTS, and extend into the first source layer SL1.

The first source layer SL1 may surround a lower portion of each of the channel structures CH. The first source layer SL1 may include a doped semiconductor layer, including a source dopant. A source dopant may include an n-type impurity. According to an embodiment, the first source layer SL1 may be formed by injecting a source dopant from a surface of the substrate SUB described with reference to FIG. 1A towards the inside of the substrate SUB. According to an embodiment, the first source layer SL1 may be formed by depositing a doped semiconductor layer on the substrate SUB, described with reference to FIG. 1B. When the first source layer SL1 is formed by depositing a doped semiconductor layer on the substrate SUB, an insulating layer may be disposed between the substrate SUB and the doped semiconductor layer. According to an embodiment, a doped semiconductor layer may include doped silicon.

The contact source layer CTS may be disposed on the first source layer SL1 and may contact a top surface of the first source layer SL1. The contact source layer CTS may contact a sidewall of each of the channel structures CH and surround the channel structures CH.

A multilayer film, extending along the sidewall of each of the channel structures CH, may be divided into a first multilayer pattern ML1 and a second multilayer pattern ML2. The first multilayer pattern ML1 may be defined as a pattern surrounding an upper end of each of the channel structures CH. The second multilayer pattern ML2 may be defined as a pattern disposed between the first source layer SL1 and each of the channel structures CH.

The second source layer SL2 may be disposed between the contact source layer CTS and the source select line SSL. The second source layer SL2 may surround the first multilayer pattern ML1. The second source layer SL2 may be omitted in some cases. The second source layer SL2 may be penetrated by the first slit SI1. The contact source layer CTS may surround the channel structures CH without surrounding the first or second multilayer patterns ML1 or ML2.

Each of the contact source layer CTS and the second source layer SL2 as described above may include a doped semiconductor layer including a source dopant. A source dopant may include an n-type impurity. According to an embodiment, a doped semiconductor layer may include a doped silicon layer.

Figure 4:
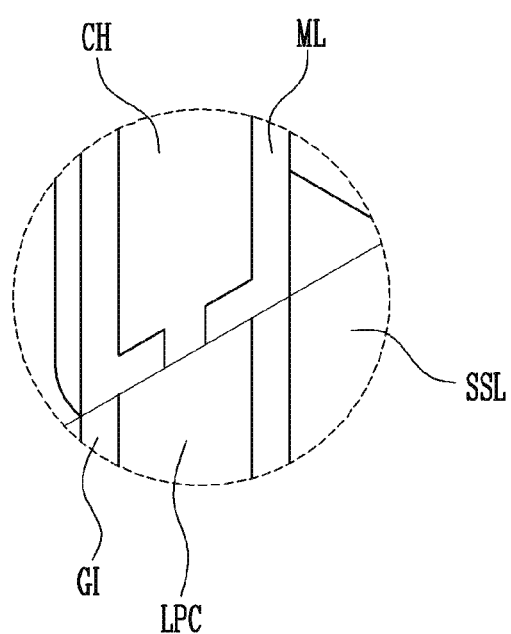
FIG. 4 is an enlarged view of region X shown in FIG. 3C.

FIG. 4 is an enlarged view of region X shown in FIG. 3C.

Referring to FIGS. 3C and 4, each of the channel structures CH may be coupled to a lower channel structure LPC corresponding thereto.

The lower channel structure LPC may be coupled to the channel structure CH corresponding thereto under the channel structure CH. Each of the channel structures CH may be surrounded by the multilayer film ML. The multilayer film ML may extend along a sidewall of the channel structure CH corresponding to the multilayer film ML. A top surface and a bottom surface of the channel structure CH may be opened and is not blocked by the multilayer film ML.

The lower channel structure LPC may pass through at least one source select line SSL, disposed under the word lines WL. A sidewall of the lower channel structure LPC may be surrounded by a gate insulating layer GI. The gate insulating layer GI may extend along the sidewall of the lower channel structure LPC. A top surface and a bottom surface of the lower channel structure LPC may be opened and is not blocked by the gate insulating layer GI.

The source layer SL may contact the bottom surface of the lower channel structure LPC. The source layer SL may include the same material as the source layer SL, described with reference to FIG. 3A.

Referring to FIG. 3D, each of the channel structures CH may include pillar portions PL passing through the electrode patterns CP1 to CPn and a horizontal portion HP, extending in the plane perpendicular the first direction I from the pillar portions PL. The horizontal portions HP of the channel structures CH may extend below the first electrode patterns CP1. The horizontal portions HP may be separated from each other by a slit extended portion SIE, which extends from the first slit SI1. A doped region DA may be disposed under the horizontal portions HP. In other words, the horizontal portions HP may be disposed between the doped region DA and the first electrode patterns CP1.

According to an embodiment, the doped region DA may include a doped semiconductor layer, including a well dopant. A well dopant may include a p-type impurity. According to an embodiment, the doped region DA may be formed by injecting a well dopant to a predetermined thickness from a surface of the substrate SUB described with reference to FIG. 1A. According to an embodiment, the doped region DA may be formed by depositing a doped semiconductor layer on the substrate SUB described with reference to FIG. 1B. When the doped region DA is formed by depositing a doped semiconductor layer on the substrate SUB, an insulating layer may be disposed between the substrate SUB and the doped semiconductor layer. According to an embodiment, a doped semiconductor layer may include doped silicon.

A sidewall of each of the pillar portions PL may be surrounded by the multilayer film ML. The multilayer film ML may extend between the horizontal portion HP, corresponding thereto, and the first electrode pattern CP1. The multilayer film ML may extend between the horizontal portion HP, corresponding thereto, and the doped region DA.

Referring to FIG. 3E, the electrode patterns CP1 to CPn may be divided into source side electrode patterns CP_S and drain side electrode patterns CP_D by the first slit SI1.

At least the nth source side pattern CPn, disposed in the nth layer among the source side electrode patterns CP_S, may serve as the source select line SSL. However, the embodiments are not limited thereto, and electrode patterns, disposed in two or more layers, may serve as the source select lines SSL, respectively. According to an embodiment, the nth source side pattern CPn and the (n−1)th source side pattern CPn−1 that are disposed in the nth layer and the (n−1)th layer, respectively, among the source side electrode patterns CP_S, may serve as the source select lines SSL, respectively. Electrode patterns disposed under the source select line SSL among the source side electrode patterns CP_S. For example, the electrode patterns CP1 to CPn−2 may serve as word lines WL_S.

At least the nth drain side pattern CPn, disposed in the nth layer among the drain side electrode patterns CP_D, may serve as the drain select line DSL. However, the embodiments are not limited thereto, and electrode patterns, disposed in two or more layers, may serve as the drain select lines DSL, respectively. According to an embodiment, the nth drain side pattern CPn and the (n−1)th drain side pattern CPn−1 that are disposed in the nth layer and the (n−1)th layer, respectively, among the drain side electrode patterns CP_D, may serve as the drain select lines DSL, respectively. Electrode patterns disposed under the drain select line DSL among the drain side electrode patterns CP_D. For example, the electrode patterns CP1 to CPn−2 may serve as word lines WL_D.

A common source line CSL may be disposed above the source side electrode patterns CP_S. The common source line CSL may be disposed in a different layer from the bit line BL. The common source line CSL and the bit line BL may include a conductive material and may be spaced apart from each other. For example, the common source line CSL may be disposed between the bit line BL and the source side electrode patterns CP_S.

Each of the channel structures CH may include a source side pillar S_PL, a drain side pillar D_PL, and the horizontal portion HP. The drain side pillar D_PL may be electrically coupled to the bit line BL. The drain side pillar D_PL may extend to pass through the drain side electrode patterns CP_D and may be coupled to the horizontal portion HP. The source side pillar S_PL may be electrically coupled to the common source line CSL. The source side pillar S_PL may extend to pass through the source side electrode patterns CP_S and may be coupled to the horizontal portion HP. The horizontal portion HP may be buried in a pipe gate PG. The source side pillar S_PL and the drain side pillar D_PL may extend from the horizontal portion HP in the first direction I. The pipe gate PG may be disposed under the source side electrode patterns CP_S and the drain side electrode patterns CP_D and may surround the horizontal portion HP. The pipe gate PG may serve as a gate of a pipe transistor. The pipe transistor may electrically couple the source side pillar S_PL and the drain side pillar D_PL through the horizontal portion HP in accordance with a signal transmitted to the pipe gate PG.

An outer wall of each of the channel structures CH may be surrounded by the multilayer film ML. The multilayer film ML may extend along an outer wall of the drain side pillar D_PL, an outer wall of the horizontal portion HP, and an outer wall of the source side pillar S_PL of the channel structure CH, corresponding to the multilayer film ML.

The first slit SI1 may be disposed between the source side electrode patterns CP_S and the drain side electrode patterns CP_D, the source side electrode patterns CP_S and the drain side electrode patterns CP_D neighbor each other in the second direction II, and may extend in the third direction III. Each of the source side electrode patterns CP_S, the drain side electrode patterns CP_D, and the common source line CSL may have a linear shape extending in the third direction III.

The word lines WL, WL_D, or WL_S, described above, with reference to FIGS. 3A to 3E, may serve as gates of memory cells. Each of the drain select lines DSL may serve as a gate of a drain select transistor, and each of the source select lines SSL may serve as a gate of a source select transistor. The multilayer film ML, ML1, or ML2 may include a data storage layer storing data.

The electrode patterns CP1 to CPn, as shown in FIGS. 3A to 3E, may be penetrated by supports.

Figure 5A:
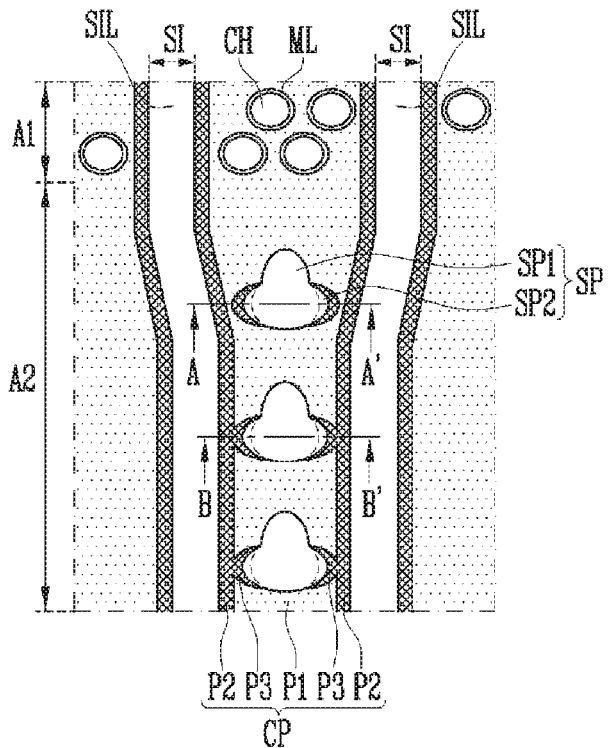
FIGS. 5A and 5B are plan views illustrating electrode patterns and supports according to embodiments.
Figure 5B:
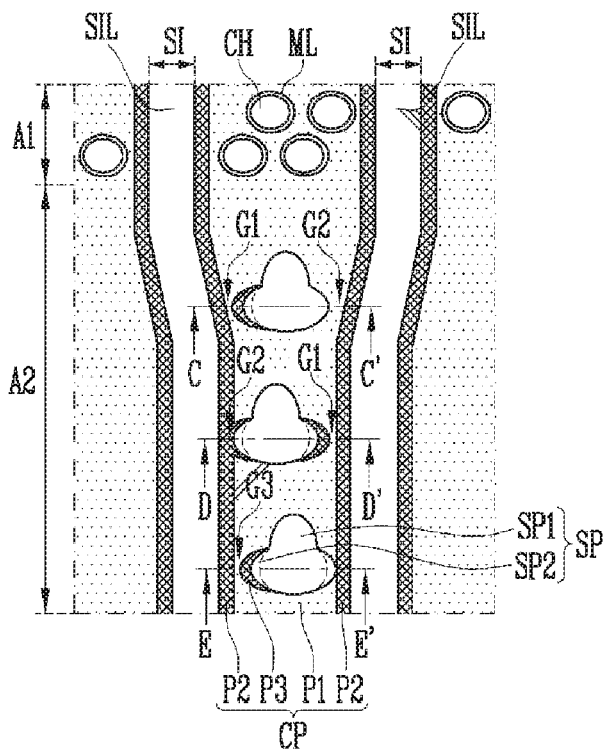

FIGS. 5A and 5B are plan views, illustrating electrode patterns and supports, according to embodiments. Each of the electrode patterns CP, as shown in FIGS. 5A and 5B, may correspond to one among the electrode patterns CP1 to CPn as shown in FIGS. 3A to 3E.

Each of the electrode patterns CP of a semiconductor device, according to an embodiment, may include a first region A1 and a second region A2, extending from the first region A1. The first region A1 of each of the electrode patterns CP may be penetrated by the channel structures CH, surrounded by the multilayer film ML. The second region A2 of each of the electrode patterns CP may be penetrated by supports SP.

Each of the electrode patterns CP may include a first conductive pattern P1, second conductive patterns P2, and third conductive patterns P3. The first conductive pattern P1 may include a first conductive material, and each of the second and third conductive patterns P2 and P3 may include a second conductive material, having a lower resistance than the first conductive material. For example, a first conductive material may include a barrier metal layer, and a second conductive material may include a metal layer. According to an embodiment, a first conductive material may include a titanium nitride layer, and a second conductive material may include a tungsten layer.

The first conductive pattern P1 may be disposed between slit insulating layers SIL, which fills slits SI. The first conductive pattern P1 may be penetrated by the supports SP and may fill a region between the channel structures CH. Since the first conductive pattern P1 includes the first conductive material, including the barrier metal layer, a phenomenon, in which metal that constitutes the second conductive material is diffused into the channel structures CH, may be prevented. In addition, since the first conductive pattern P1 includes the first conductive material, including the barrier metal layer, a phenomenon in which pollutants, which are generated when the second conductive material including metal is formed, remain between the channel structures CH, may be prevented.

The second conductive patterns P2 may extend along both side portions of the first conductive pattern P1, facing the slits SI, respectively. The third conductive patterns P3 may extend along a sidewall of each of the supports SP. Since the second conductive patterns P2 and the third conductive patterns P3 include the second conductive material, having lower resistance than the first conductive material, the resistance of each of the electrode patterns CP may be decreased.

Each of the slits SI may extend in a curved shape in the second region A2. However, embodiments are not limited thereto. For example, each of the slits SI may extend to have a straight shape, or a wavy shape.

The supports SP may be arranged next to each other in a line as shown in FIG. 5A. However, embodiments are not limited thereto. For example, the supports SP may be arranged in a zigzag pattern as shown in FIG. 5B. Arrangements of the supports SP may be variously changed to increase bearing capacity.

Referring to FIGS. 5A and 5B, each of the supports SP may have a T-shaped cross-sectional structure, including protrusions which protrude towards the slits SI, to increase bearing capacity. Each of the third conductive patterns P3 may extend along a sidewall of one of the protrusions of the support SP corresponding to the third conductive pattern P3.

Each of the supports SP may include a first portion SP1 and at least one second portion SP2. According to an embodiment, each of the supports SP may include the first portion SP1 and the second portions SP2 that are disposed at both sides of the first portion SP1, respectively, as shown in FIG. 5A. According to an embodiment, each of the supports SP may include the first portion SP1 and the second portion SP2 that is disposed between one of the slits SI and the first portion SP1, as shown in FIG. 5B.

The first portion SP1 and the second portion SP2 may be an insulating material and the same material. The first portion SP1 and the second portion SP2 may be formed by different processes from each other.

Referring to FIGS. 5A and 5B, a distance between the supports SP and the second conductive patterns P2 may be variously designed.

According to an embodiment, each of the supports SP may be spaced apart at the same distance from the second conductive patterns P2, adjacent to each other, as shown in FIG. 5A. According to this embodiment, a distance between the support SP and the second conductive patterns P2 may be determined depending on three cases. According to the first case, a distance between the support SP and the second conductive pattern P2 may be the same as a width of the third conductive pattern P3. According to the second case, a distance between the support SP and the second conductive pattern P2 may be smaller than the width of the third conductive pattern P3. According to the third case, a distance between the support SP and the second conductive pattern P2 may be greater than the width of the third conductive pattern P3. According to the first and second cases, the second conductive pattern P2 and the third conductive pattern P3 that are adjacent to each other may be coupled to each other. According to the third case, the first conductive pattern P1 may extend between the second conductive pattern P2 and the third conductive pattern P3 that are adjacent to each other.

According to an embodiment, each of the supports SP may be arranged closer to one of the second conductive patterns P2 adjacent to each other as shown in FIG. 5B. The distances between the supports SP and the second conductive patterns P2 may correspond to at least one of the fourth case and the fifth case.

The support SP corresponding to the fourth case may be spaced apart from one of the second conductive patterns P2, disposed at both sides of the support SP, at a first distance G1, and may be spaced apart from the other second conductive patterns P2, disposed at both sides of the support SP, at a second distance G2, smaller than the first distance G1. The first distance G1 and the second distance G2 may be changed depending on a position of the supports SP. The first and third conductive patterns P1 and P3 may extend to fill the first distance G1. The first conductive pattern P1 may extend between the third conductive pattern P3 and the second conductive pattern P2 that are adjacent to each other. The first conductive pattern P1 or the third conductive pattern P3 may extend to fill the second distance G2. For example, the first conductive pattern P1 may extend between the support SP and the second conductive pattern P2 that are spaced apart from each other at the second distance G2 and may completely fill the second distance G2. In another example, the third conductive pattern P3 may extend between the support SP and the second conductive pattern P2 that are spaced apart from each other at the second distance G2 and may be coupled to the second conductive pattern P2 and the support SP.

The support SP, corresponding to the fifth case, may be spaced apart from one of the second conductive patterns P2, disposed at both sides of the support SP, at a third distance G3 and may be coupled to the other second conductive pattern P2 disposed at both sides of the support SP.

Figure 6A:
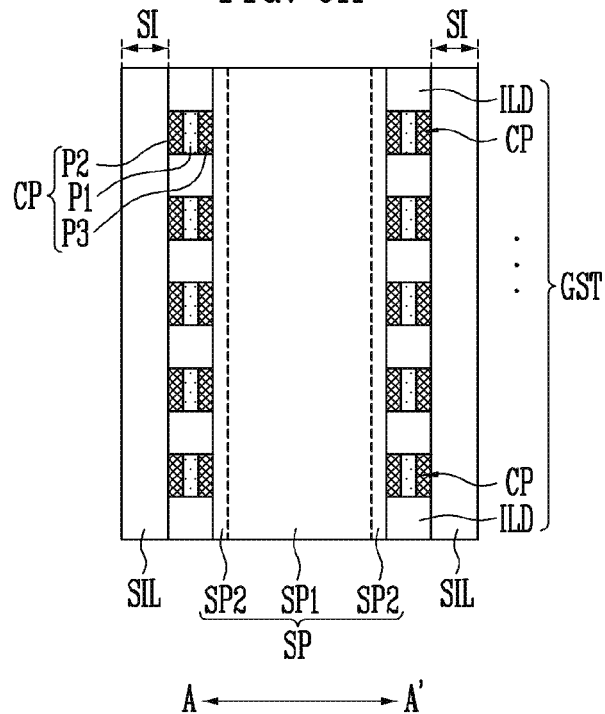
FIGS. 6A to 6E are cross-sectional diagrams illustrating a semiconductor device according to embodiments.
Figure 6B:
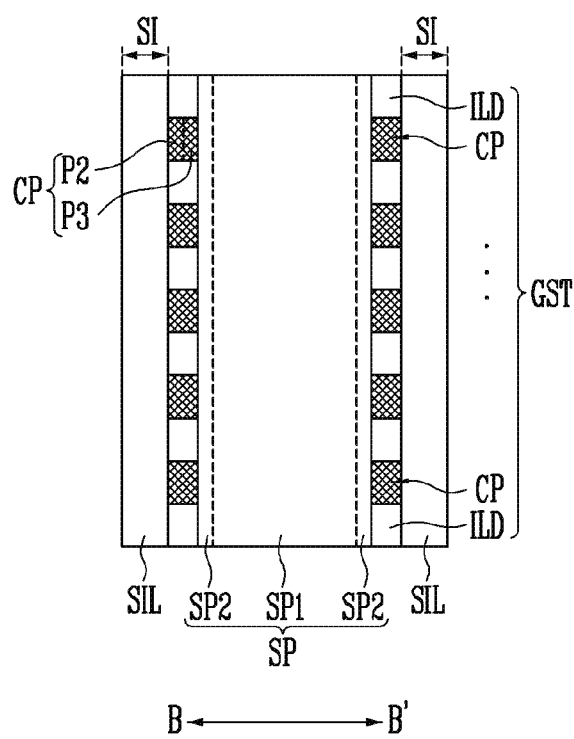
Figure 6C:
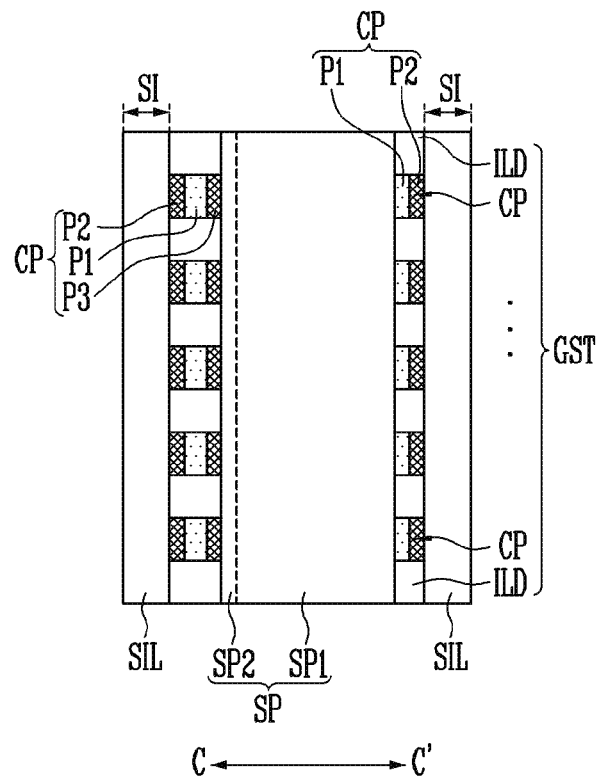
Figure 6D:
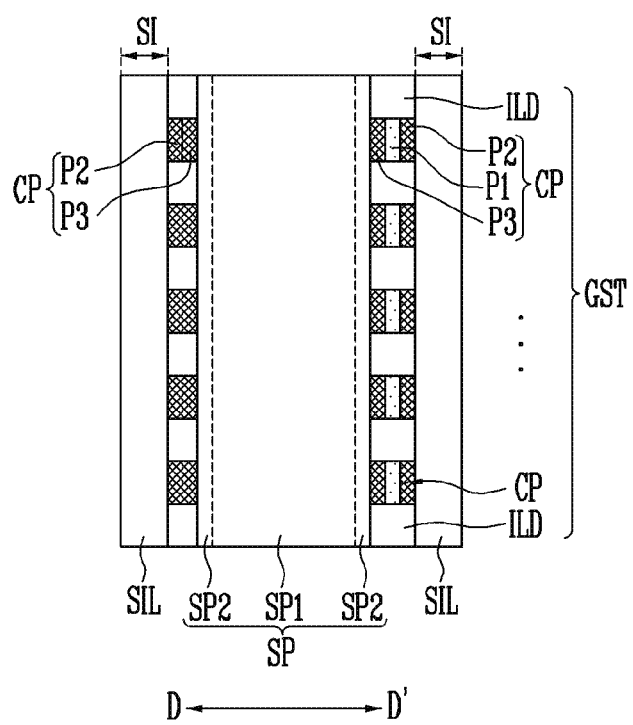
Figure 6E:
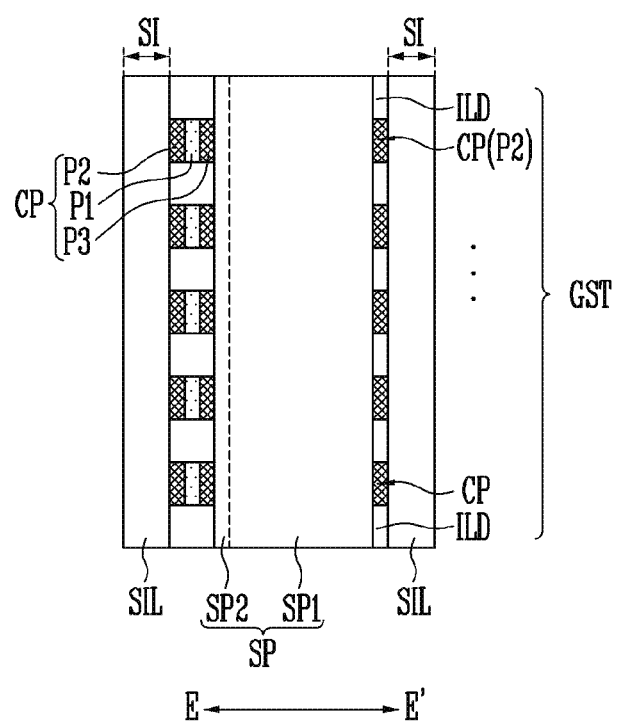

FIGS. 6A to 6E are cross-sectional diagrams illustrating a semiconductor device according to embodiments. FIGS. 6A and 6B illustrate cross-sectional diagrams of the semiconductor device taken along lines A-A' and B-B' of FIG. 5A, respectively, and FIGS. 6C, 6D, and 6E illustrate cross-sectional diagrams of the semiconductor device taken along lines C-C', D-D', and E-E' of FIG. 5B, respectively.

Referring to FIGS. 6A to 6E, the semiconductor device according to embodiments may include a gate stack structure GST. The gate stack structure GST may be penetrated by the slits SI and include interlayer insulating layers ILD stacked to be spaced apart from each other. The interlayer insulating layers ILD may be penetrated by the supports SP disposed between the slits SI. The gate stack structure GST may be disposed between the slits SI and include the electrode patterns CP, filling spaces between the interlayer insulating layers ILD adjacent to each other in a direction in which the interlayer insulating layers ILD are stacked. According to the structure as described above, the gate stack structure GST may be disposed between the slits SI and include the interlayer insulating layers ILD and the electrode patterns CP that are alternately stacked on each other. The supports SP may extend to pass through the electrode patterns CP and the interlayer insulating layers ILD. The channel structures CH shown in FIGS. 5A and 5B may extend to pass through not only the electrode patterns CP but also the interlayer insulating layers ILD. In other words, the channel structures CH shown in FIGS. 5A and 5B may be surrounded by the electrode patterns CP and the interlayer insulating layers ILD.

The supports SP may include the first portion SP1 and at least one second portion SP2, as described above with reference to FIGS. 5A and 5B. The protrusions of the supports SP which have the T-shaped structure, described above with reference to FIGS. 5A and 5B, may be defined as portions protruding towards both sides of the gate stack structure GST.

Each of the electrode patterns CP may include the first, second, and third conductive patterns P1, P2, and P3 as described above with reference to FIGS. 5A and 5B.

The second conductive pattern P2 may be defined as a pattern extending along a side portion of the gate stack structure GST. The second conductive pattern P2 may contact at least one of the first conductive pattern P1, the third conductive pattern P3, and the support SP, as described above with reference to FIGS. 5A and 5B.

FIGS. 7A, 7B, 8A, 8B, 9A, 9B, 10A to 10C, and 11A to 11C are diagrams illustrating a manufacturing method of a semiconductor device according to an embodiment.

Figure 7A:
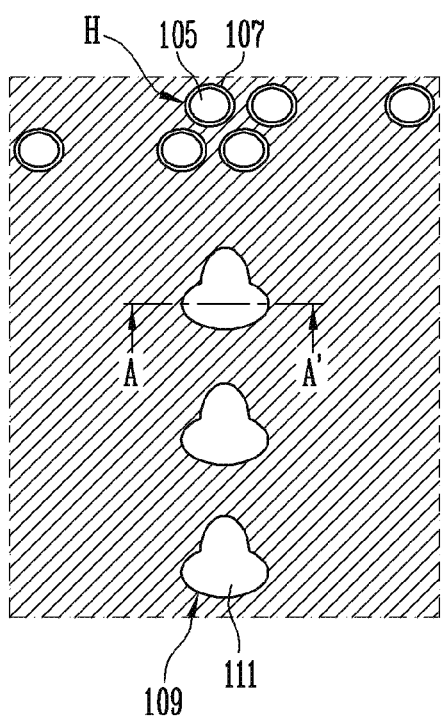
FIGS. 7A, 7B, 8A, 8B, 9A, 9B, 10A to 10C, and 11A to 11C are diagrams illustrating a manufacturing method of a semiconductor device according to an embodiment.
Figure 7B:
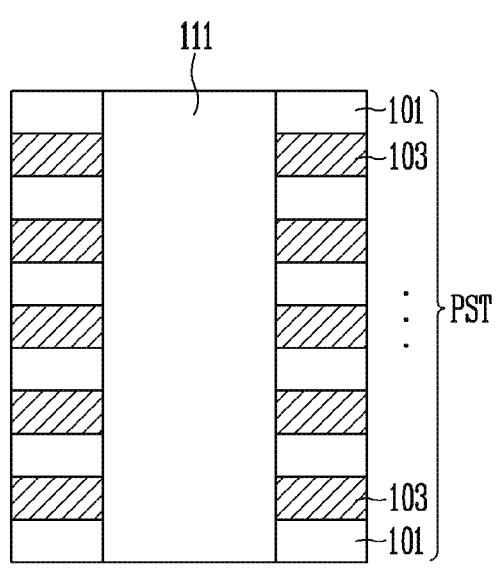

FIGS. 7A and 7B are a plan view and a cross-sectional diagram, respectively, which illustrate forming processes of a preliminary stack structure PST, including interlayer insulating layers 101 and sacrificial layers 103 that surround channel structures 105 and first supports 111 and that are alternately stacked on each other. FIG. 7A illustrates a plan view of one layer of the sacrificial layers 103 of the preliminary stack structure PST, and FIG. 7B illustrates a cross section of the preliminary stack structure PST taken along line A-A' of 7A.

Referring to FIGS. 7A and 7B, the preliminary stack structure PST may be formed by alternately stacking the interlayer insulating layers 101 and the sacrificial layers 103. The sacrificial layers 103 may include a different material from the interlayer insulating layers 101. For example, the interlayer insulating layers 101 may include an oxide such as a silicon oxide layer. The sacrificial layers 103 may include a material having a different etch rate from the interlayer insulating layers 101. For example, the sacrificial layers 103 may include a nitride such as a silicon nitride layer.

After forming the preliminary stack structure PST, the channel structures 105, passing through the preliminary stack structure PST, may be formed. Forming the channel structures 105 may include forming holes H, passing through the preliminary stack structure PST, and filling the holes H with the channel structures 105, respectively. Before forming the channel structures 105, forming a multilayer film 107 on a sidewall of each of the holes H may be further included. Each of the channel structures 105 may be formed on the multilayer film 107.

Forming the multilayer film 107 may include sequentially stacking a first blocking insulating layer, a data storage layer, and a tunnel insulating layer from the sidewall of each of the holes H towards a central region of each of the holes H. The first blocking insulating layer may include an oxide layer capable of blocking charges. The data storage layer may include a charge trap layer, a material layer including conductive nanodots, or a phase-change material layer. The data storage layer may store data changed by using Fowler-Nordheim tunneling. The data storage layer may include a silicon nitride layer, capable of trapping charges. The data storage layer may store data on the basis of another operating principle in addition to Fowler-Nordheim tunneling. For example, the data storage layer may include a phase-change material layer and store data according to a phase change. The tunnel insulating layer may include a silicon oxide layer, allowing charge tunneling.

Each of the channel structures 105 may include a semiconductor layer. For example, each of the channel structures 105 may include a silicon layer. When the central region of each of the holes H is not completely filled with the semiconductor layer, a core insulating layer, filling the central region of each of the holes H, may be further formed.

Subsequently, vertical through portions 109, passing through the interlayer insulating layers 101 and the sacrificial layers 103, may be formed by etching the preliminary stack structure PST. Thereafter, the first supports 111, filling the vertical through portions 109, may be formed. The first supports 111 may include an insulating material. For example, the first supports 111 may include an oxide layer. The vertical through portions 109 may have the shape and the arrangement that correspond to the shape and the arrangement of the first supports 111. Each of the first supports 111 may have a T-shaped structure to increase bearing capacity as described above with reference to FIGS. 4A and 4B. The first supports 111 may have the same arrangement as the supports shown in FIG. 5A, or the same arrangement as the supports shown in FIG. 5B.

Figure 8A:
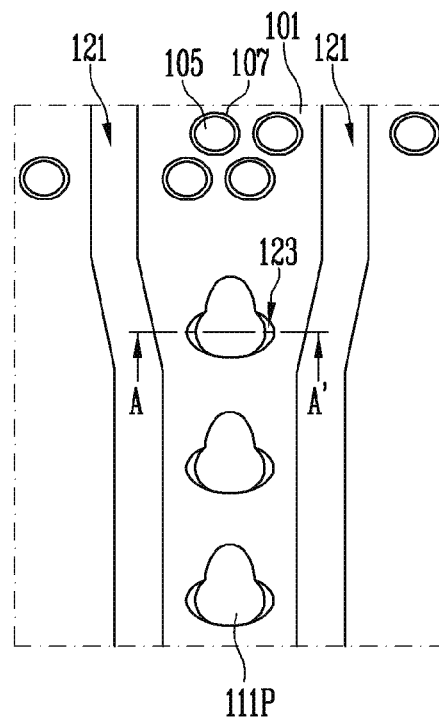
Figure 8B:
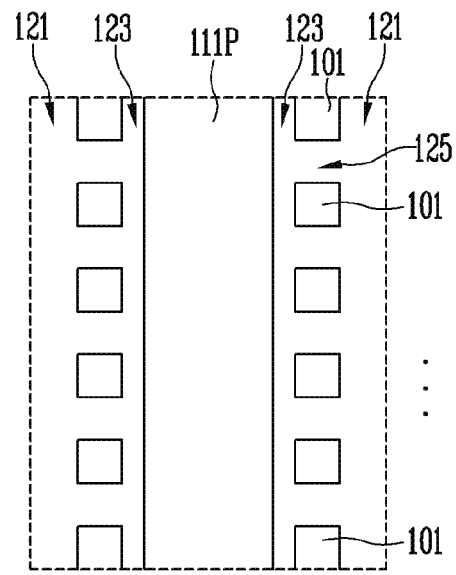

FIGS. 8A and 8B are a plan view and a cross-sectional diagram, respectively, which illustrate a forming process of slits 121 and first openings 123 and a forming process of second openings 125. FIG. 8A illustrates a plan view of one layer of the interlayer insulating layers 101 and FIG. 8B illustrates a cross section of a stack structure taken along line A-A' of FIG. 8A.

Referring to FIGS. 8A and 8B, the slits 121 and the first openings 123, which pass through the preliminary stack structure PST, shown in FIG. 7B, may be simultaneously formed. The first supports 111 of FIG. 7A may be disposed between the slits 121, adjacent to each other. The first openings 123 may open side portions of the first supports 111 of FIG. 7A. Each of the first openings 123 may overlap some of the first supports 111. The first supports 111, overlapped with the first openings 123, may be partially etched. Each of the first supports 111P, remaining without being removed by the forming process of the first openings 123, may be defined as the first portion SP1 of the support described above with reference to FIGS. 5A, 5B, and 6A to 6E.

The first openings 123 may define a region, in which the second portions SP2 shown in FIG. 5A, to be formed or define a region, in which the second portions SP2 shown in FIG. 5B, to be formed.

Subsequently, the sacrificial layers 103, shown in FIGS. 7A and 7B, may be removed through the slits 121 and the first openings 123. Thereby, the second openings 125 may be formed between the interlayer insulating layers 101, adjacent to each other, in a direction in which the interlayer insulating layers 101 are stacked on each other.

Figure 9A:
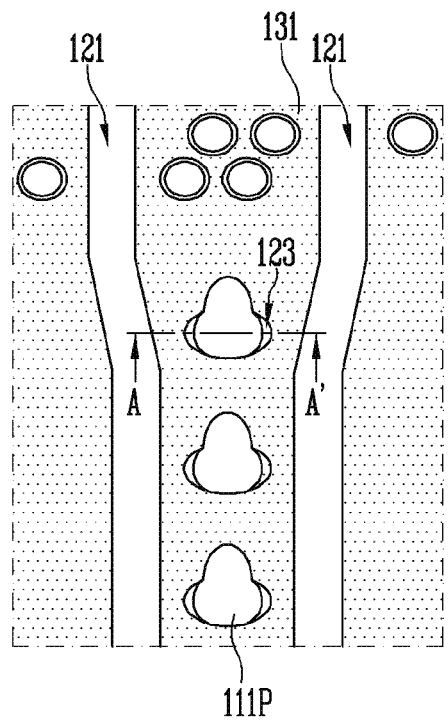
Figure 9B:
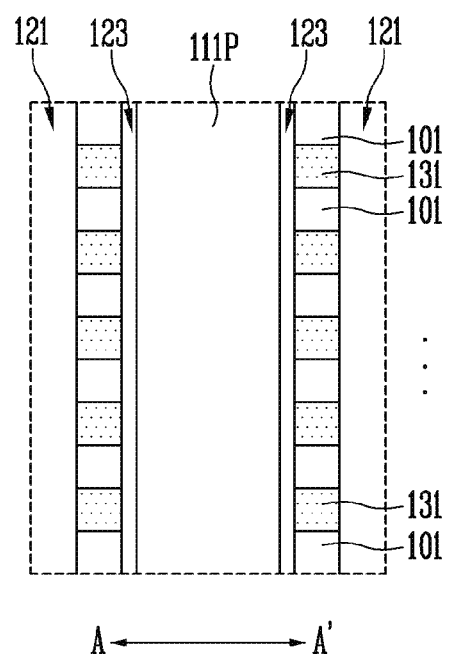

FIGS. 9A and 9B are a plan view and a cross-sectional diagram, respectively, which illustrate a process of filling each of the second openings 125 with a first conductive material 131. FIG. 9A illustrates a plan view of the first conductive material 131 filling one of the second openings 125, and FIG. 9B illustrates a cross section of the stack structure which is taken along line A-A' of FIG. 9A.

Referring to FIGS. 9A and 9B, the first conductive material 131 may be introduced into the second openings 125 shown in FIG. 8B through the slits 121 and the first openings 123. Each of the second openings 125 may be filled with the first conductive material 131. The first conductive material 131 may include barrier metal. For example, the first conductive material 131 may include a titanium nitride (TiN) layer.

Figure 10A:
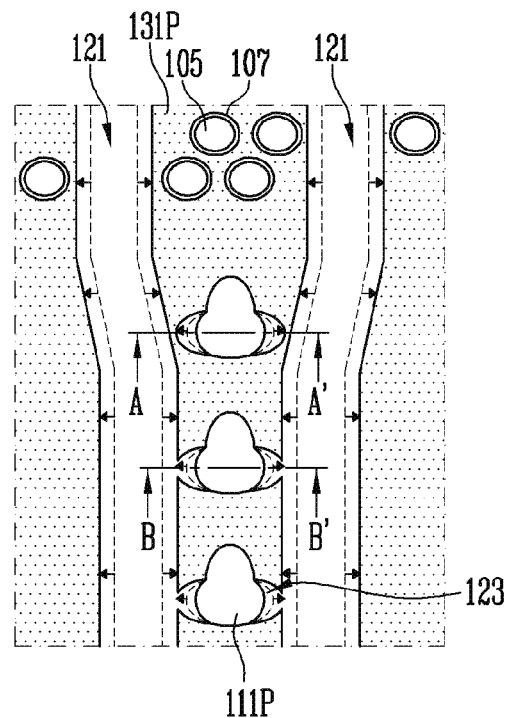
Figure 10B:
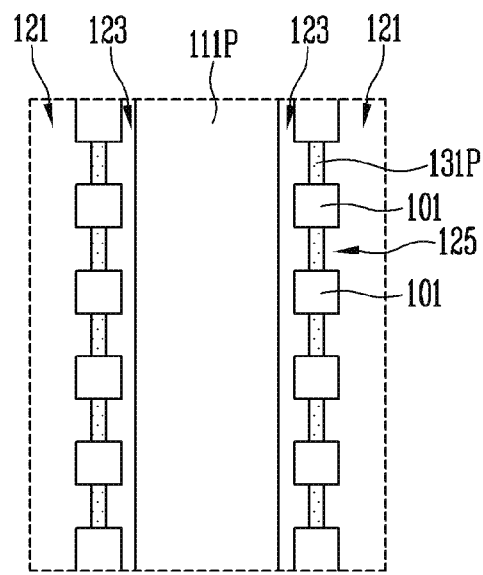
Figure 10C:
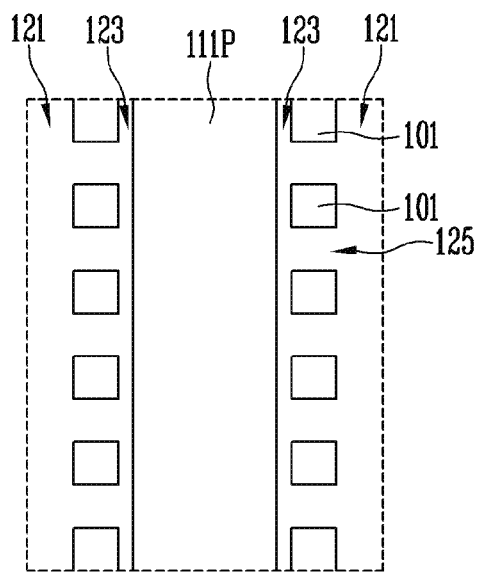

FIGS. 10A to 10C are diagrams illustrating a process of forming first conductive patterns 131P. FIG. 10A illustrates a plan view of one layer in which the first conductive patterns 131P are disposed. FIG. 10B illustrates a cross section of the stack structure which is taken along line A-A' of FIG. 10A, and FIG. 10C illustrates a cross section of the stack structure, which is taken along line B-B' of FIG. 10A.

Referring to FIGS. 10A to 10C, portions of the first conductive material 131, which are adjacent to the slits 121 and the first openings 123, shown in FIGS. 9A to 9B, may be removed through the slits 121 and the first openings 123. The portions of the first conductive material 131 may be removed by an etching material introduced from the slits 121 and the first openings 123 in directions of arrows shown in FIG. 10A. Thereby, portions of each of the second openings 125, which are adjacent to the slits 121 and the first openings 123, may be opened. The first conductive material 131, which is not to be etched and remains in the second openings 125, may be defined as the first conductive patterns 131P.

The first conductive patterns 131P may remain to fill a region between the channel structures 105, disposed between the slits 121. The first conductive patterns 131P, including barrier metal, may prevent metal from a second conductive material, to be formed later from diffusing towards the channel structures 105. In addition, the first conductive patterns 131P, including the barrier metal, may prevent a phenomenon in which pollutants, which are generated when the second conductive material is formed during a subsequent process, remain between the channel structures 105.

Figure 11A:
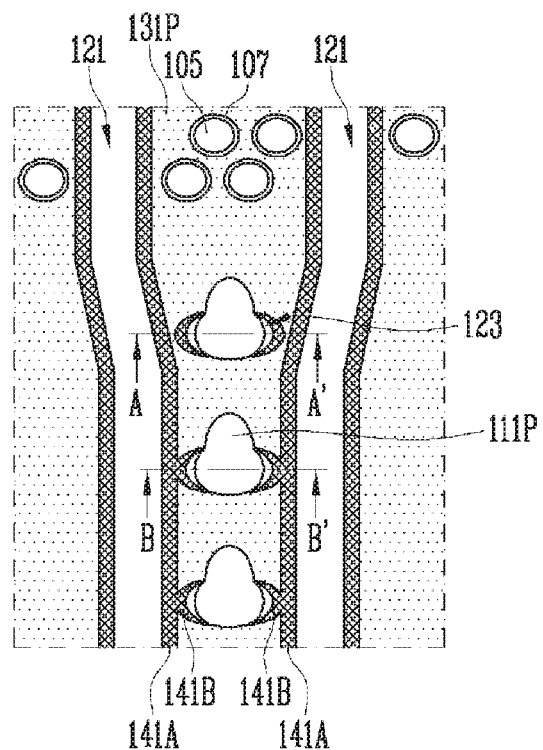
Figure 11B:
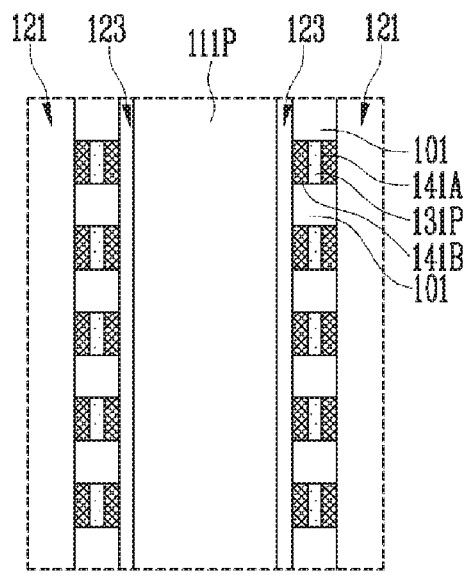
Figure 11C:
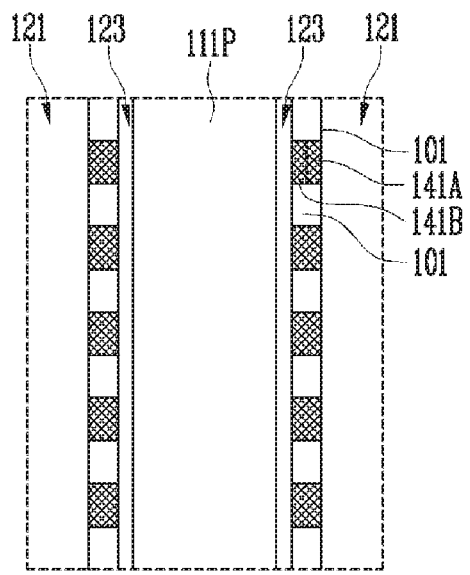

FIGS. 11A to 11C are a plan view and cross-sectional diagrams, illustrating a process of forming second conductive patterns 141A and third conductive patterns 141B. FIG. 11A illustrates a plan view of one layer in which the second conductive patterns 141A and the third conductive patterns 141B are disposed. FIG. 11B illustrates a cross section of the stack structure, which is taken along line A-A' of FIG. 11A, and FIG. 11C illustrates a cross section of the stack structure, which is taken along line B-B' of FIG. 11A.

Referring to FIGS. 11A to 11C, portions of each of the second openings 125, opened by the processes described above with reference to FIGS. 10A to 10C, may be filled with a second conductive material through the slits 121 and the first openings 123. The second conductive material may include a material having a lower resistance than the first conductive material of the first conductive patterns 131P. For example, the second conductive material may include metal, and the metal may include tungsten.

Subsequently, the second conductive material may be etched to be divided into the second conductive patterns 141A and the third conductive patterns 141B. The second conductive patterns 141A may be defined as patterns disposed adjacent to the slits 121, and the third conductive patterns 141B may be defined as patterns disposed adjacent to the first openings 123.

The second conductive patterns 141A and the third conductive patterns 141B, which are disposed in the same layer and adjacent to each other, may be coupled to each other or may be separated from each other by the first conductive pattern 131P. Layouts of the second conductive pattern 141A and the third conductive pattern 141B may be variously changed, as described above with reference to FIGS. 5A and 5B.

Each of the first openings 123, disposed between the slits 121, may expose a sidewall of the first support 111P corresponding to the first opening 123. Portions of the first supports 111P, which are exposed by the first openings 123, may be variously changed depending on an arrangement of the first supports 111P. For example, protruding sidewalls of both sides of each of the first supports 111P may be spaced apart at the same distance from the slits 121, adjacent to each other, as shown in FIG. 11A. The protruding sidewalls of both sides of each of the first supports 111P, which face the slits 121, may be exposed by the first openings 123, respectively. However, embodiments are not limited thereto. For example, the first supports 111P may be arranged to be closer to one of the slits 121, as shown by the supports SP in FIG. 5B. Portions of the protruding sidewalls of both sides of each of the first supports 111P, which face the slits 121, may be exposed by the first openings 123. In other words, according to the embodiment, at least one sidewall of each of the first supports 111P, which faces the slits 121, may be exposed by some of the first openings 123.

Subsequently, the first openings 123 may be filled with an insulating material, forming the second portions SP2 of the support described above with reference to FIGS. 5A and 5B.

According to the embodiment, since the second conductive material, having low resistance, may be introduced, not only through the slits 121, but also through the first openings 123, resistance of the electrode patterns, disposed between the interlayer insulating layers 101, may be decreased, not only by the second conductive pattern 141A, but also by the third conductive pattern 141B.

Figure 12:
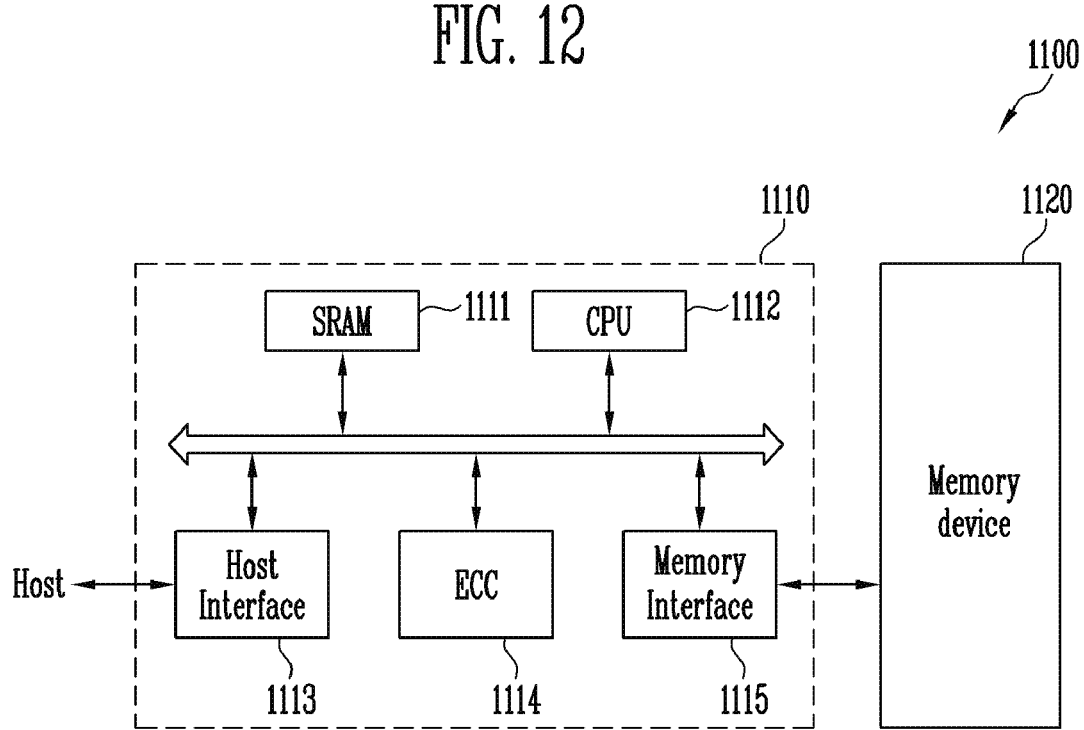
FIG. 12 is a block diagram illustrating the configuration of a memory system according to an embodiment.

FIG. 12 is a block diagram illustrating the configuration of a memory system 1100 according to an embodiment.

Referring FIG. 12, the memory system 1100 according to an embodiment may include a memory device 1120 and a memory controller 1110.

The memory device 1120 may be a multi-chip package including a plurality of flash memory chips. The memory device 1120 may include at least one of the electrode patterns shown in FIGS. 5A and 5B.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112, the CPU 1112 may perform overall control operations for data exchange of the memory controller 1110, and the host interface 1113 may include a data exchange protocol of a host accessing the memory system 1100. In addition, the ECC 1114 may detect and correct errors included in the data read from the memory element 1120, and the memory interface 1115 may perform interfacing with the memory device 1120. In addition, the memory controller 1110 may further include a Read Only Memory (ROM) for storing code data for interfacing with the host.

The memory system 1100 having the above-described configuration may be a Solid State Disk (SSD) or a memory card in which the memory device 1120 and the memory controller 1110 are combined. For example, when the memory system 1100 is an SSD, the memory controller 1110 may communicate with an external device (e.g., a host) through one of the interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 13:
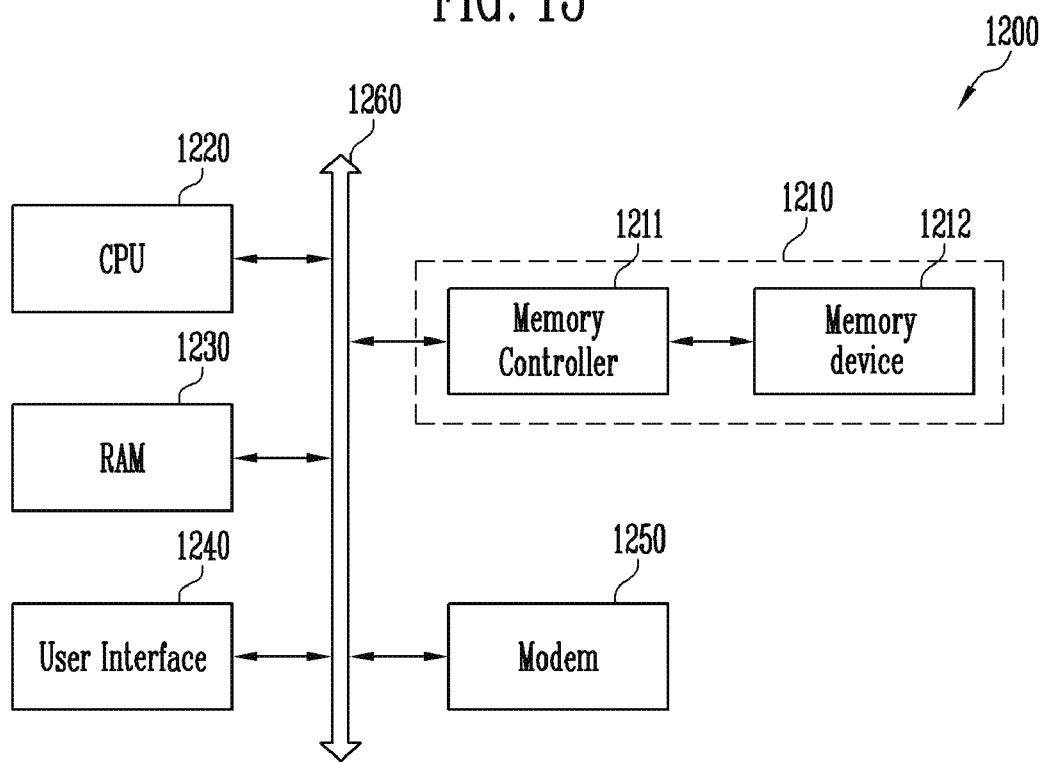
FIG. 13 is a block diagram illustrating the configuration of a computing system according to an embodiment.

FIG. 13 is a block diagram illustrating the configuration of a computing system 1200 according to an embodiment.

Referring to FIG. 13, the computing system 1200 according to the embodiment may include a CPU 1220, a Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included.

According to embodiments, low resistance of an electrode pattern may be secured by forming an opening at least one side of a support and forming the electrode pattern through the opening. Thereby, according to embodiments, operational reliability of a semiconductor device may be improved.

The above-discussed embodiments aim to help those with ordinary knowledge in this art more clearly understand the present disclosure rather than aiming to limit the metes bounds of the present disclosure. It should be understood that many variations and modifications of the basic inventive concept described herein will still fall within the spirit and scope of the present disclosure as defined in the accompanying claims and equivalents thereof.

So far as not being differently defined, all terms used herein including technical or scientific terminologies have meanings that they are commonly understood by those skilled in the art to which the present disclosure pertains. So far as not being clearly defined in this application, terms should not be understood in an ideally or excessively formal way.

What is claimed is:

1. A semiconductor device, comprising:
a stack structure including interlayer insulating layers and electrode patterns which are alternately stacked on each other; and
a support passing through the stack structure,
wherein each of the electrode patterns includes a first conductive pattern, penetrated by the support, at least one second conductive pattern, extending along a side portion of the stack structure, and at least one third conductive pattern disposed between the first conductive pattern and the support, and
wherein the first conductive pattern includes a first conductive material and each of the second and third conductive patterns includes a second conductive material having a lower resistance than the first conductive material.

2. The semiconductor device of claim 1, wherein the first conductive pattern extends between the second conductive pattern and the third conductive pattern.

3. The semiconductor device of claim 1, wherein the second conductive pattern is coupled to the third conductive pattern.

4. The semiconductor device of claim 1, further comprising channel structures passing through the stack structure.

5. The semiconductor device of claim 1, wherein the support includes protrusions protruding towards both sides of the stack structure to form a T-shape.

6. The semiconductor device of claim 5, wherein the third conductive pattern extends along a sidewall of at least one of the protrusions.

7. A semiconductor device, comprising:
interlayer insulating layers stacked to be spaced apart from each other;
a support passing through the interlayer insulating layers;
at least one opening passing through the interlayer insulating layers to expose a sidewall of the support; and
electrode patterns filling spaces between the interlayer insulating layers,
wherein the semiconductor device further comprises slits passing through the interlayer insulating layer, and wherein the at least one opening is formed along the sidewall of the support which faces at least one of the slits.

8. The semiconductor device of claim 7, wherein each of the electrode patterns comprises:
a first conductive pattern penetrated by the support;
a second conductive patterns disposed adjacent to each of the slits and extending along a side portion of the first conductive pattern which faces each of the slits; and
a third conductive pattern disposed adjacent to at least one of the at least one opening.

9. The semiconductor device of claim 8, wherein the first conductive pattern includes a first conductive material, and wherein each of the second and third conductive patterns includes a second conductive material having a lower resistance than the first conductive material.

10. The semiconductor device of claim 8, wherein the first conductive pattern extends between the second conductive pattern and the third conductive pattern.

11. The semiconductor device of claim 8, wherein the second conductive pattern is coupled to the third conductive pattern.

12. The semiconductor device of claim 8, wherein the support includes protrusions protruding towards the slits to form a T-shape, and wherein the third conductive pattern extends along a sidewall of at least one of the protrusions.

13. The semiconductor device of claim 7, further comprising channel structures passing through the interlayer insulating layers and the electrode patterns.

14. A method of manufacturing a semiconductor device, the method comprising:

forming a stack structure including interlayer insulating layers and sacrificial layers, which surround a support and are alternately stacked on each other;

forming slits which pass through the stack structure, wherein the support is disposed between the slits;

forming a first opening which passes through the stack structure, wherein the first opening opens a side portion of the support;

forming second openings by removing the sacrificial layers through the slits and the first opening; and forming an electrode pattern in each of the second openings through the slits and the first opening.

15. The method of claim 14, wherein the forming of the electrode pattern comprises:

forming a first conductive material filling each of the second openings through the slits and the first opening;

forming a first conductive pattern exposing a portion of each of the second openings, adjacent to the slits and the first opening, by partially etching the first conductive material through the slits and the first opening;

filling the portion of each of the second openings which is exposed by the first conductive pattern with a second conductive material through the slits and the first opening; and forming a second conductive pattern adjacent to each of the slits, and a third conductive pattern adjacent to the first opening by etching the second conductive material.

16. The method of claim 15, wherein the second conductive material has a lower resistance than the first conductive material.

17. The method of claim 15, wherein the first conductive material includes a titanium nitride layer, and wherein the second conductive material includes tungsten.

18. The method of claim 15, wherein the second conductive pattern and the third conductive pattern are coupled to each other.

19. The method of claim 15, wherein the second conductive pattern and the third conductive pattern are separated from each other by the first conductive pattern.

\* \* \* \* \*